(12) United States Patent
Calo et al.

(10) Patent No.: US 7,586,179 B2
(45) Date of Patent: Sep. 8, 2009

(54) WIRELESS SEMICONDUCTOR PACKAGE FOR EFFICIENT HEAT DISSIPATION

(75) Inventors: Paul Armand Calo, Lapu-Lapu (PH); Margie T. Rios, Mandaue (PH); Tiburcio A. Maldo, Suzhou (CN); JoonSeo Son, Mapo Gu (KR); Erwin Ian V. Almagro, Dumaguete (PH)

(73) Assignee: Fairchild Semiconductor Corporation, South Portland, ME (US)

( * ) Notice: Subject to any disclaimer, the term of this patent is extended or adjusted under 35 U.S.C. 154(b) by 57 days.

(21) Appl. No.: 11/869,307

(22) Filed: Oct. 9, 2007

(65) Prior Publication Data

US 2009/0091010 A1 Apr. 9, 2009

(51) Int. Cl.
H01L 23/495 (2006.01)
H01L 23/02 (2006.01)
H01L 23/10 (2006.01)
H01L 23/34 (2006.01)

(52) U.S. Cl. .............. 257/675; 257/685; 257/707; 257/723; 257/E23.031; 257/E23.037; 257/E23.039; 257/E23.101; 257/E23.103; 257/E23.105

(58) Field of Classification Search .......... 257/675, 257/E23.101, 23.103, E23.105, 676, 685, 257/707, 723, E23.031, E23.037, E23.039
See application file for complete search history.

(56) References Cited

U.S. PATENT DOCUMENTS

| | | | |
|---|---|---|---|
| 4,477,827 A | 10/1984 | Walker | |
| 4,546,374 A | 10/1985 | Olsen | |
| 4,990,987 A | 2/1991 | Boucher | |
| 5,200,640 A | 4/1993 | Scheftic et al. | |
| 5,289,344 A * | 2/1994 | Gagnon et al. | 361/712 |
| 5,661,342 A * | 8/1997 | Kawamoto | 257/712 |
| 5,714,789 A | 2/1998 | Estes | |
| 5,859,387 A * | 1/1999 | Gagnon | 174/531 |
| 5,926,372 A * | 7/1999 | Rinehart et al. | 361/704 |
| 6,040,626 A | 3/2000 | Cheah | |
| 6,246,115 B1 | 6/2001 | Tang et al. | |
| 6,255,722 B1 * | 7/2001 | Ewer et al. | 257/676 |
| 6,404,065 B1 * | 6/2002 | Choi | 257/782 |
| 6,465,276 B2 | 10/2002 | Kuo | |
| 6,476,481 B2 * | 11/2002 | Woodworth et al. | 257/696 |
| 6,518,885 B1 | 2/2003 | Brady | |
| 6,975,023 B2 * | 12/2005 | Oliver et al. | 257/676 |
| 7,250,659 B2 * | 7/2007 | Troost | 257/355 |
| 7,332,808 B2 * | 2/2008 | Sakamoto et al. | 257/723 |
| 7,466,016 B2 * | 12/2008 | Yang | 257/676 |
| 2004/0145037 A1 * | 7/2004 | Yang | 257/675 |
| 2004/0256703 A1 | 12/2004 | Tu | |
| 2007/0200219 A1 * | 8/2007 | Otremba | 257/692 |
| 2007/0219033 A1 * | 9/2007 | Otremba | 474/213 |

(Continued)

OTHER PUBLICATIONS

Moltz, Eddie; Use and Handling of Semiconductor Packages with ENIG Pad Finishes, Application Report, Aug. 2004 (9 pages).

*Primary Examiner*—Ida M Soward
(74) *Attorney, Agent, or Firm*—Thomas R. FitzGerald, Esq.; Peter J. Mikesell; Hiscock & Barclay, LLP

(57) ABSTRACT

Disclosed in this specification is a wireless semiconductor package with multiple dies, at least two of which are attached to a thermally and electrically conductive heat sink. The package provides an efficient means for dissipating heat.

13 Claims, 7 Drawing Sheets

U.S. PATENT DOCUMENTS

2008/0122113 A1 * 5/2008 Corisis et al. ............... 257/777
2008/0164590 A1 * 7/2008 Xiaochun et al. ........... 257/675
2008/0290484 A1 * 11/2008 Low et al. ................... 257/675

* cited by examiner

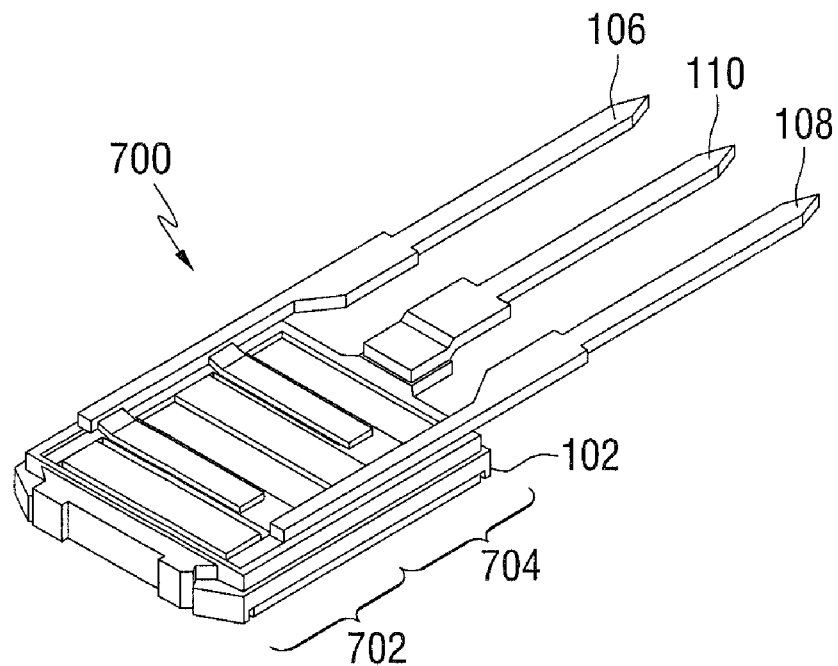
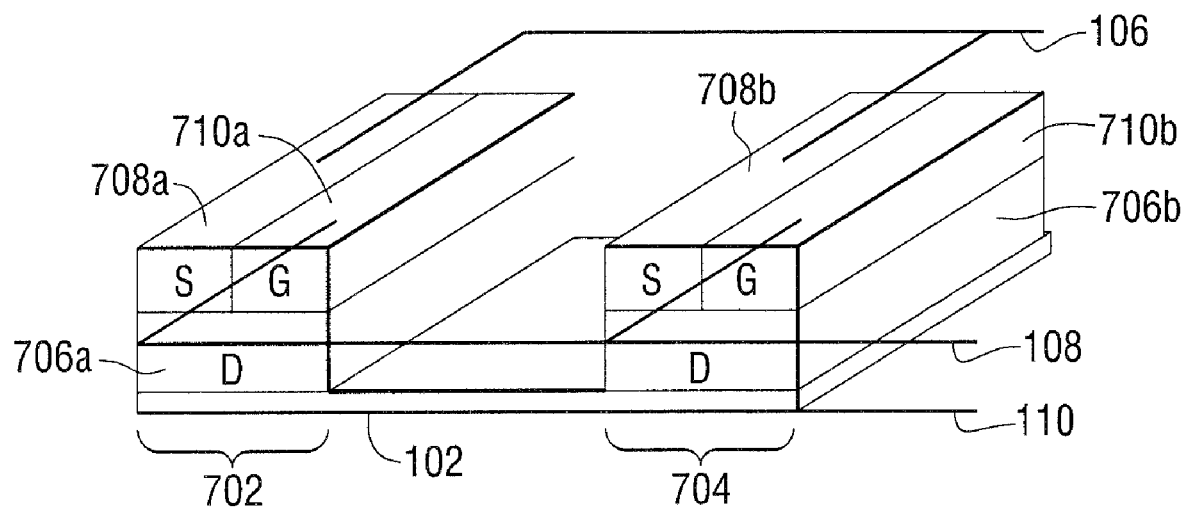
FIG. 7

WIRELESS SEMICONDUCTOR PACKAGE FOR EFFICIENT HEAT DISSIPATION

FIELD OF THE INVENTION

This invention relates, in one embodiment, to a wireless semiconductor package with at least two semiconductor dies. The two dies are configured in such a manner that heat may be efficiently dissipated.

BACKGROUND OF THEE INVENTION

Semiconductor devices are often plagued by heat dissipation problems. For example, simple diodes will produce heat during use and excessive heating can damage or destroy the semiconductor device. Other semiconductor devices also suffer from similar shortcomings. In addition to overheating, repeated cycles of heating and cooling often cause components of the devices to fail. The wires that are present in such devices are another source of mechanical failure. Moreover, it is difficult and expensive to attach such wires to the semiconductor die, as specialized machinery and extra manufacturing steps are required for such attachment. A number of attempts have been made to overcome these deficiencies, but none have proven entirely satisfactory.

U.S. Pat. No. 4,990,987 to Boucher, et at. (Over-temperature sensor and protector for semiconductor devices) discloses a semiconductor device with a thermistor which is in a heat sensing relationship with the semiconductor. As the temperature of the device rises beyond a certain threshold, the resistance of the thermistor increases. In this fashion, overheating of the device can be prevented.

U.S. Pat. No. 5,714,789 to Estes, et al. (Circuit board-mounted IC package cooling apparatus) discloses a semiconductor package filled with a thermally conductive liquid that helps dissipate heat. Unfortunately, the use of such liquid systems has proven problematic.

Therefore, a more efficient method of dissipating the heat generated by a semiconductor device is desired.

It is also desired to provide a semiconductor device that obviates wires connecting the die to the lead frame.

SUMMARY OF THE INVENTION

The invention comprises, in one form thereof, a packaged assembly with a plurality of semiconductor devices, such as diodes. In one embodiment, these dies are wirelessly connected in series. Such a configuration promotes the dissipation of heat from the semiconductor devices as well as provides a sturdy, wireless construct.

An advantage of the present invention is that the heat is distributed over a wider area, and is therefore more efficiently dissipated.

A further advantage of the present invention is that no wires are needed to connect the semiconductor dies to the lead frame. Such a configuration is substantially more sturdy than prior art semiconductors and omits the wiring step during the fabrication of the device. Additionally, the wireless attachments also function as thermal conductors and dissipate heat.

BRIEF DESCRIPTION OF THE DRAWINGS

The present invention is disclosed with reference to the accompanying drawings, wherein:

FIG. 7 is a profile view of another embodiment of the invention.

Corresponding reference characters indicate corresponding parts throughout the several views. The examples set out herein illustrate several embodiments of the invention but should not be construed as limiting the scope of the invention in any manner.

DETAILED DESCRIPTION OF A PREFERRED EMBODIMENT

Figure 1:
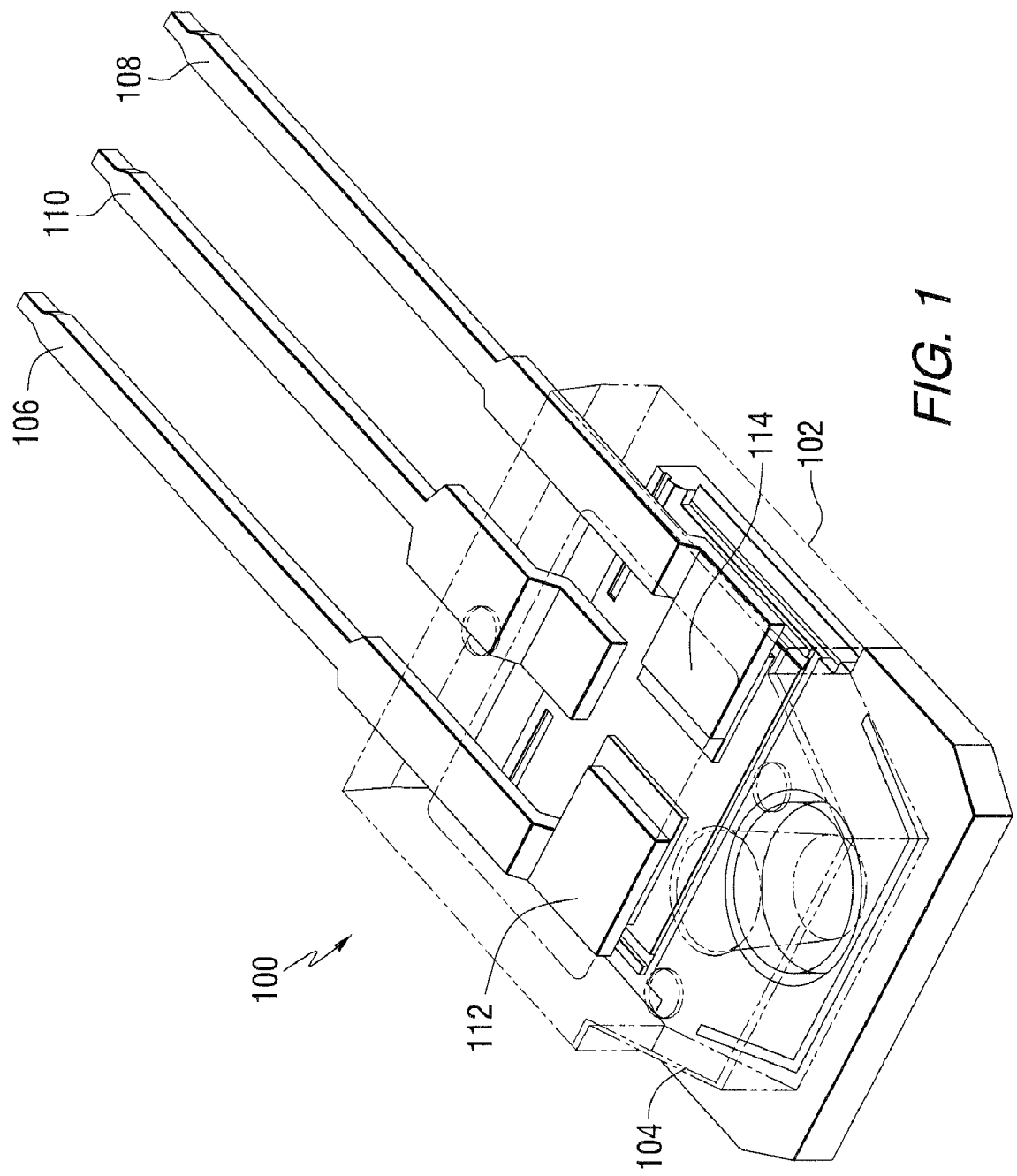
FIG. 1 is a view of a packaged semiconductor assembly showing the inner components of the housing.
Figure 2:
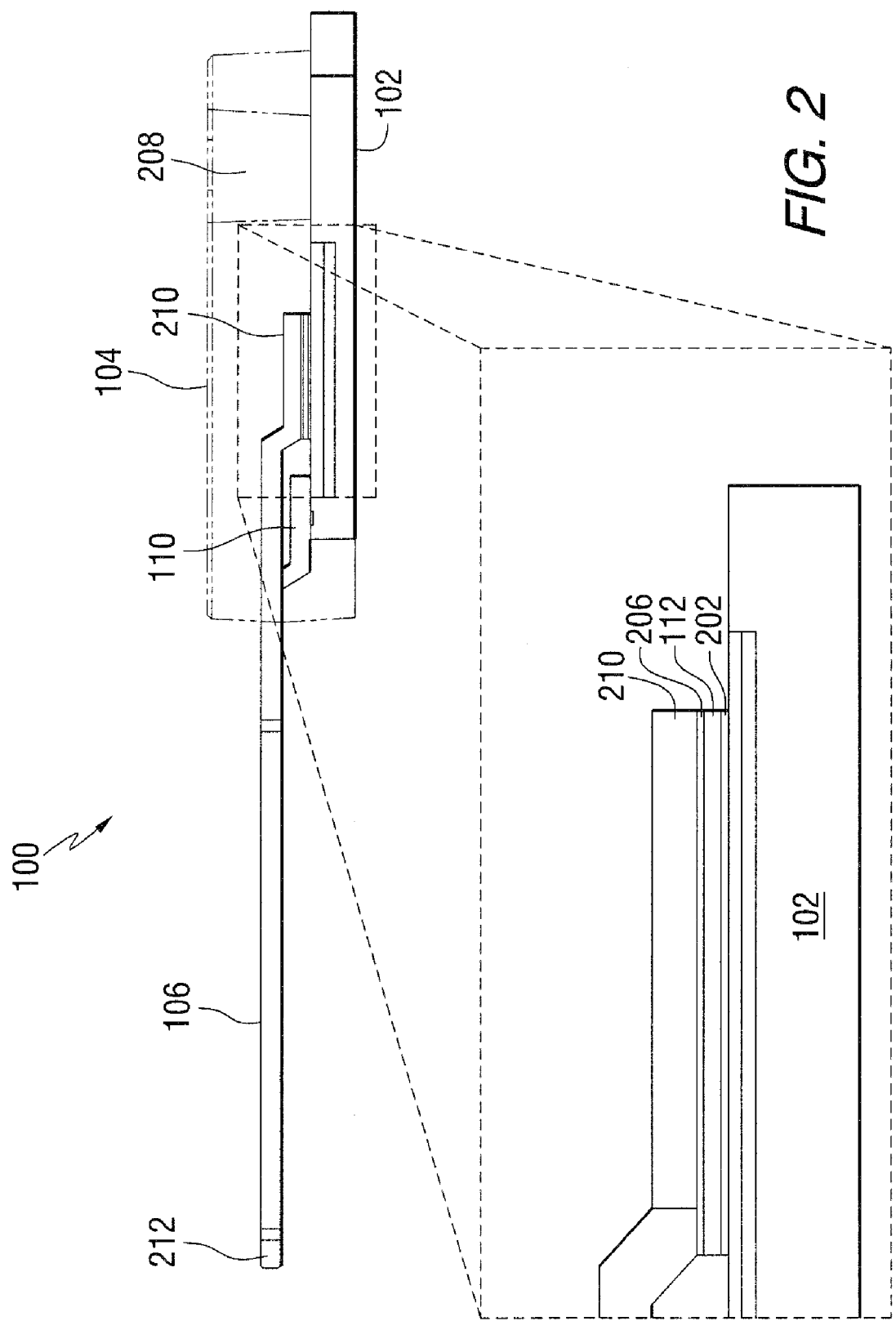
FIG. 2 is a side view of the package of FIG. 1.

FIG. 1 is a view of a packaged semiconductor package 100. Semiconductor package 100 has a plurality of leads 106, 108 and 110, each of which extend out of epoxy molding compound 104. Epoxy molding compound 104 is shown in phantom to better illustrate the internal components of package 100. The bottom face of epoxy molding compound 104 holds a heat sink 102. In one embodiment, heat sink 102 is an electrically and thermally conductive material, such as copper. Dies 112 and 114 are disposed within epoxy molding compound 104. In the embodiment depicted in FIG. 1, these dies are wirelessly connected in series. In another embodiment, not shown, the dies are connected wirelessly in parallel. As will be discussed in further detail elsewhere in this specification, such a wireless configuration permits the dies 112 and 114 to be disposed between a heat sink 102 and a die attach pad 210 (see FIG. 2), both of which are thermally and electrically conductive. This wireless configuration enables the two dies to share a common lead (lead 110) as well as provides an efficient means for dissipating heat. Typical prior art semiconductor devices have one lead for each terminal on the device. The wireless configuration disclosed herein contains fewer leads than terminals. The wireless configuration also places the die in a position where it is contiguous with two thermally conductive members—a heat sink and a lead. In such a system, the heat sink and the lead serve a dual purpose as both thermal conductors and electrical conductors. FIG. 2 depicts part of this novel configuration.

FIG. 2 is a side view of the package 100 of FIG. 1 which illustrates some of the components inside epoxy molding compound 104. In the embodiment depicted in FIG. 2, one side of epoxy molding compound 104 holds an embedded heat sink 102. Package 100 may be mounted to a surface (not shown) by passing a screw through mounting hole 208. One terminal of die 112 (e.g. the cathode) is in electrical communication with heat sink 102 and is attached thereto by conductive adhesive 202. The conductive adhesive 202 may be, for example, a conductive epoxy or a solder material, such as a lead-containing solder or a lead-free solder. The other terminal of die 112 (e.g. the anode) is in electrical communication with the die attach pad 210 of lead 106. Such a connection is made through conductive adhesive 206. In one embodiment, adhesive conductive 202 is a high melting solder and adhesive 206 is a low melting solder. The compositions of such solders are discussed elsewhere in this specification. Advantageously, such a configuration permits the melting of adhesive 206 without melting (and thus de-bonding) conductor 202. Lead 106 extends from within epoxy molding compound 104 and ends at end 212, which is not disposed within epoxy molding compound 104.

FIG. 2 also depicts lead 110 and its connection to heat sink 102. Lead 110 (also see FIG. 1) is connected to heat sink 102 through conductive adhesive 206. Lead 110 also extends out of epoxy molding compound 104 and runs parallel to lead 106 (see FIG. 1). Die 114 of FIG. 1 can be connected to lead 108 in an analogous manner, although the details of such a connection are discussed elsewhere in this specification.

Figure 3:
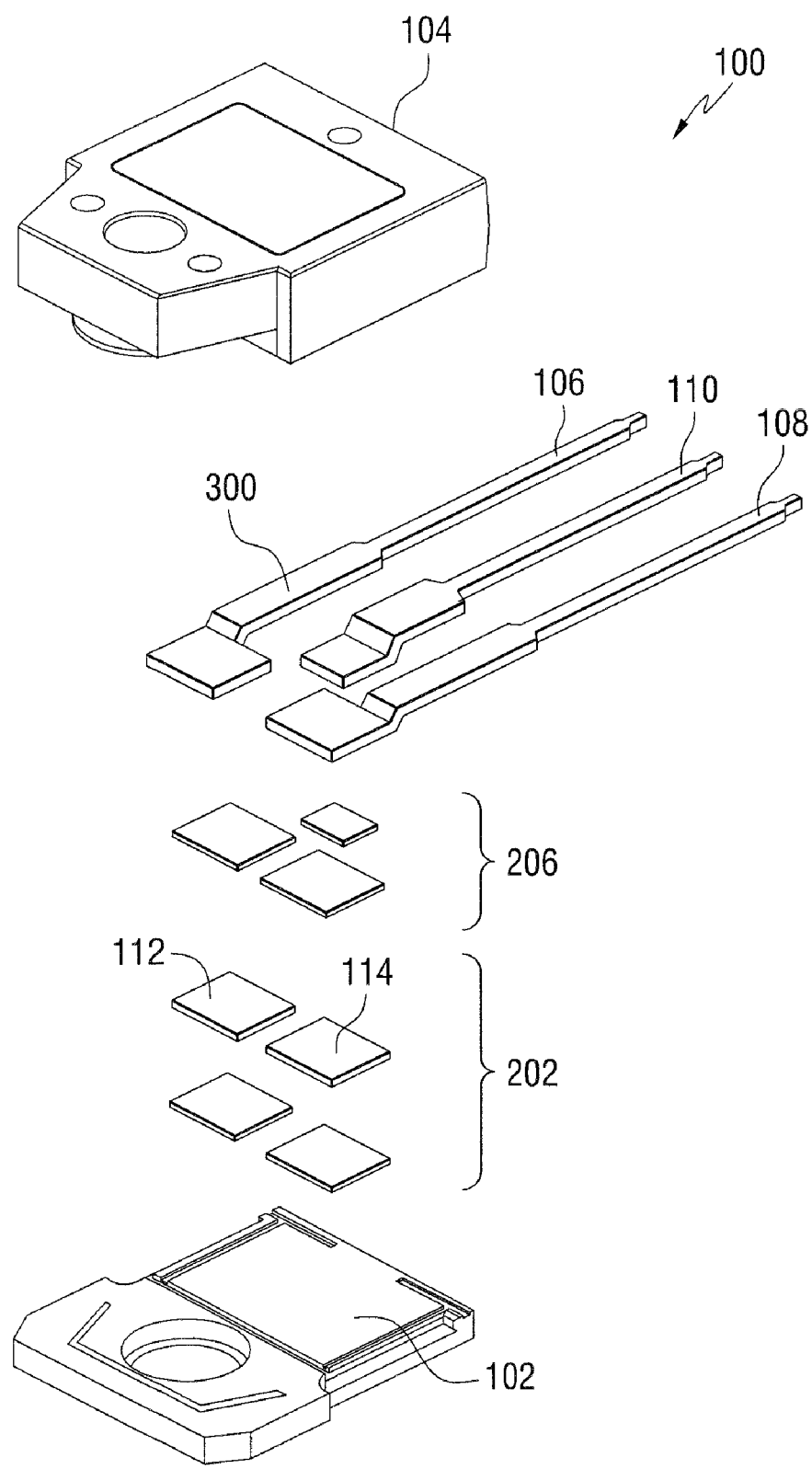
FIG. 3 is an exploded view of the components of the package of FIG. 1.

FIG. 3 is an exploded view of the package 100 of FIG. 1 which shows the layers of components inside of epoxy molding compound 104 for one embodiment of the invention. Epoxy molding compound 104 is generally made from a plastic material such as a molding compound. Molding compounds are typically polymeric resins, but other suitable packaging materials may also be used. The bottom sides of dies 112 and 114 are connected to heat sink 102 by high melting conductive adhesive 202. Dies 112 and 114 maybe, for example, simple silicon diodes. In another embodiment, a more complex semiconductor die may be used. For example, a flip-chip die may be used. The heat sink 102 may be any material that is both thermally and electrically conductive. For example, heat sink 102 may be comprised of copper. Conductive adhesive 202 may be, for example, a lead based solder such as 95.5% lead, 2% tin, and 2.5% silver or a non-lead containing material, such as an epoxy. The top sides of dies 112 and 114 are connected to the die attach pad of lead frame 300, which includes leads 106, 108, and 110, through conductive adhesive 206. Adhesive 206 is, in one embodiment, a solder material with a melting point below that of adhesive 202. For example, when adhesive 202 is 95.5% Pb, 2% Sn, and 2.5% Ag, adhesive 202 may be 88% Pb, 10% Sn, 2% Ag. Advantageously, this difference in solder compositions can be utilized to activate the low-melting solder without de-bonding the high-melting solder. In one embodiment, the solders have a difference in melting point of at least about 10° C. The lead frame 300 and leads 106, 108, and 110 are both thermally and electrically conductive and may be formed from a conductive substrate comprising an electrically conductive metal such as copper. The substrate may be plated with one or more layers of other conductive metals and metal alloys, such as nickel, palladium, and the like. One example of a lead frame material is TAMAC 4(Fe 0.07, P 0.03, Zn 0.05, and the balance Cu). Other suitable lead frame materials would be apparent to those skilled in the art. Epoxy molding compound 104 is disposed over the internal components of the assembly.

Figure 4:
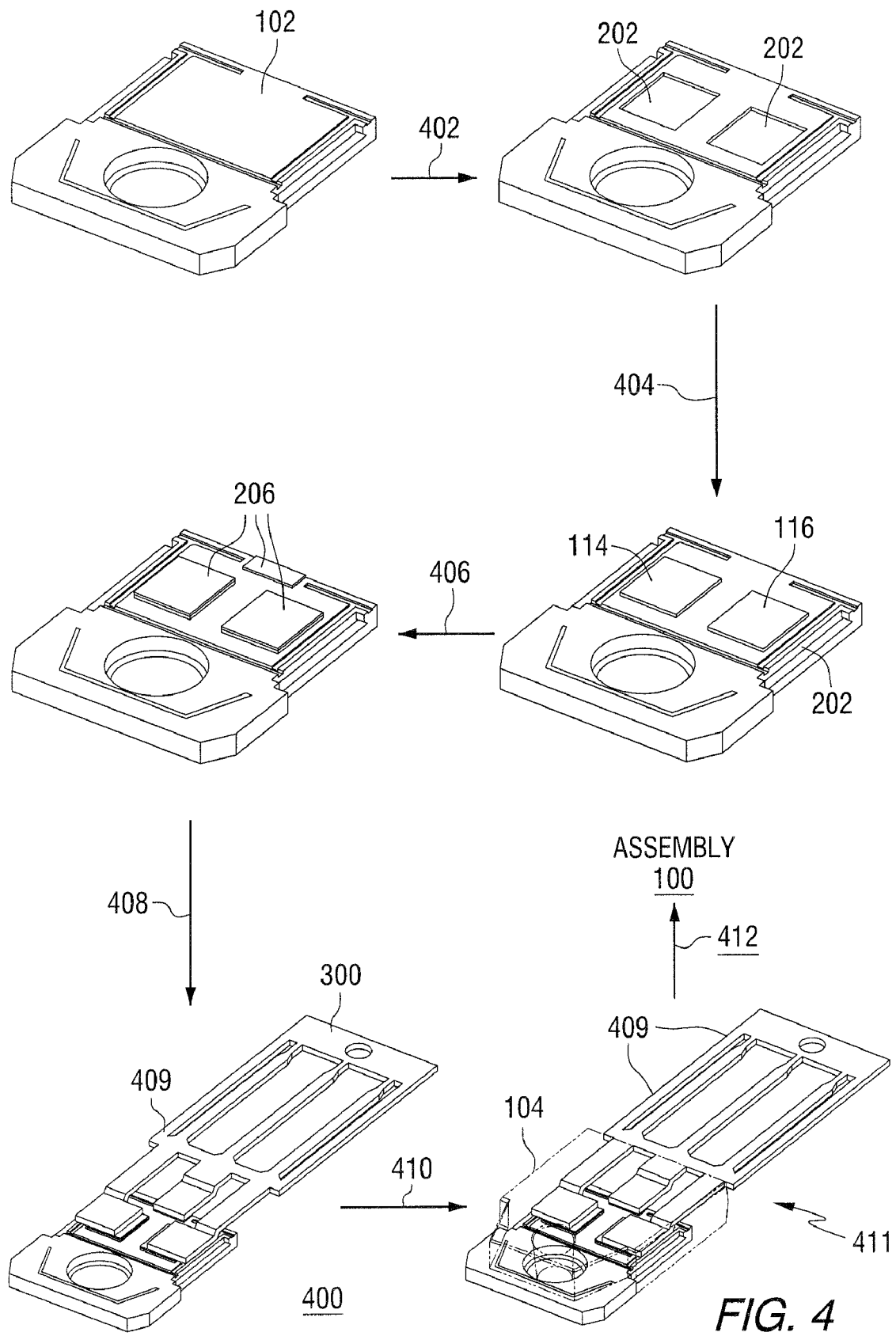
FIG. 4 is a flow diagram of one process of the invention.

FIG. 4 is a depiction of process 400 for producing a wireless semiconductor package 100. In the example shown in FIG. 4, package 100 (see FIG. 1) is produced. One of ordinary skill in the art, after benefiting from reading this specification, would readily appreciate alternative processes for producing the other assemblies discussed elsewhere in this specification. One advantage of the wire-free process 400, as compared to prior art wired processed, is the omission of tile wiring step. Since such a separate step may be omitted, the resulting process is more efficient and cost effective. The wireless configuration of the resulting product also has certain thermal advantages which are discussed elsewhere in this specification.

In step 402 of process 400, conductive adhesive 202 is mounted to heat sink 102. For example, one may use a solder formed from 95.5% Pb, 2% Sn, and 2.5% Ag to solder coat the heat sink 102. Heat sink 102 may be any suitable material that is both electrically and thermally conductive. In step 404 the dies 112 and 114 are mounted to heat sink 102 using, adhesive 202. Once the dies 112 and 114 are securely attached, conductive adhesive 206 is used to coat the upper surface of such dies in step 406. Conductive adhesive 206 may, in some embodiments, be selected to have a lower melting point than adhesive 202. For example, conductive adhesive may be formed from a composition of 88% Pb, 10% Sn, and 2% Ag. In step 408, when lead frame 300 is attached, a suitable temperature may be used to melt adhesive 206 without melting adhesive 202. Lead frame 300 may be formed from a conductive material, such as copper, and is generally plated with various metals or metal alloys. Such a lead frame 300 is shaped by stamping or etching a metal blank to create the leads 106, 108, and 110 and ties bars 409. In step 410 of process 400, the epoxy molding compound 104 is applied, thus producing intermediate assembly 411. The undesired tie bars 409 of the lead frame are then cut away in step 412, thereby generating package 100.

Figure 5:
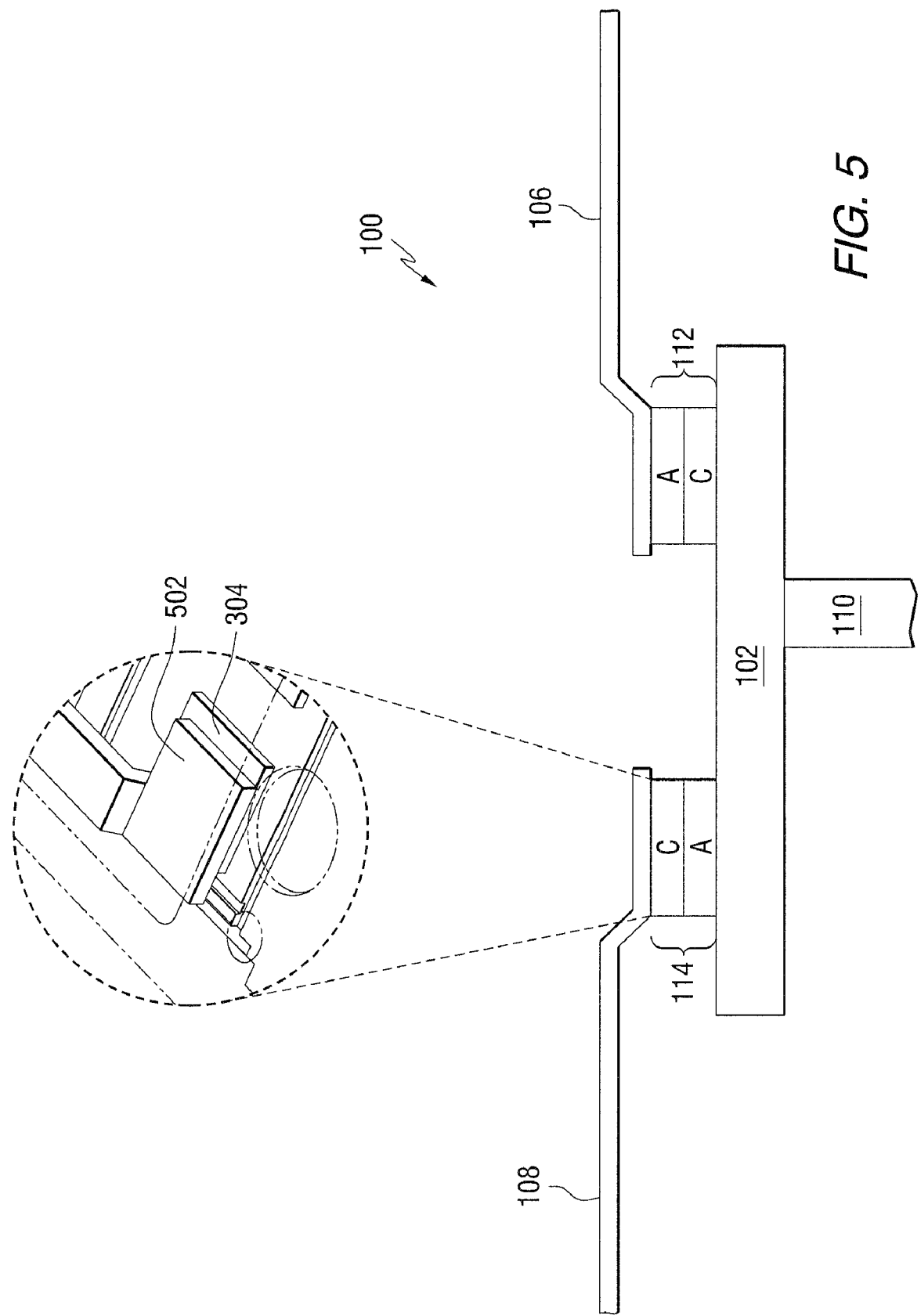
FIG. 5 is a schematic view of the inner components of one embodiment of the invention.

FIG. 5 is a schematic illustration of the electrical connections in package 100. For simplicity of illustration, the adhesives have been omitted. As can be seen in FIG. 5, the die 112 is disposed on the conductive heat sink 102 cathode side down. Conversely, die 114 is disposed on the heat sink 102 anode side down. In this manner, the two dies 112 and 114 are connected in series. When electricity passes through dies 112 and 114 heat is generated. Package 100 uses at least two semiconductor dies connected in series. Since the dies are remotely spaced from one another, the dies are more easily cooled by the environment, and the heat is dissipated more efficiently. Such a configuration increases the efficiency of heat dissipation and provides a substantial advantage over prior art semiconductor devices.

Referring again to FIG. 5, it can be seen that the leads 106 and 108 have die attach pads at one end of each elongated lead. For example, lead 108 terminates in die attach pad 502. The die attach pad 502 is disposed over the surface area of die 114 such that the surface areas of the two components are contiguous over a substantial portion of their respective areas. In one embodiment, at least half of the surface area of die 114 is covered by die attach pad 502. Such a configuration allows a wire-free electrical connection to be made, which increases the durability of the package 100. Due to the contiguous overlap of the surfaces of die attach pad 502 and die 114, die attach pad 502 acts as both a thermal and an electrical conductor. Such a configuration permits the leads 106 and 108 to dissipate heat, and greatly increases the efficiency of heat dissipation. Although only two dies are shown in the Figures, it should be appreciated that any number of dies may be so used. Additionally, other die configuration modes are possible and such modes are contemplated for use with the instant invention.

Figure 6:
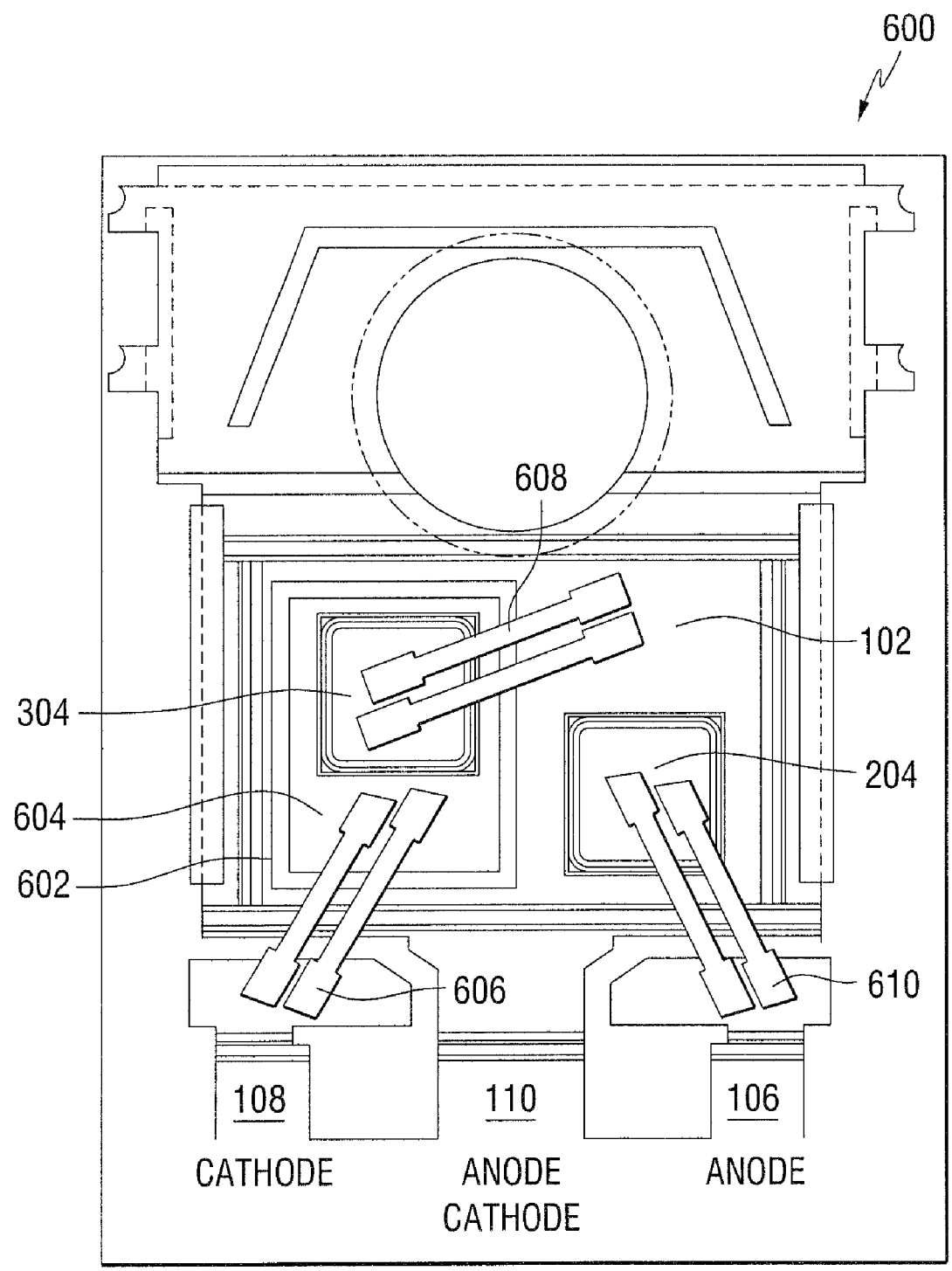
FIG. 6 is a schematic profile of the inner components a wired package.

FIG. 6 is a schematic depiction of package 600 which has an electrical configuration that differs from the configuration of package 100. In package 600, die 304 is connected to conductor 604 which is placed in electrical communication with lead 108 by connection 606. Connection 606 may be, for example, a wired connection such as a gold wire or a conductive ribbon. Conductor 604 may be, for example, a copper plate. Conductor 604 is electrically insulated from heat sink 102 by insulator 602, thus ensuring one terminal of die 304 is not electrically connected to heat sink 102. Insulator 602 may be, for example, a layer of alumina. The other terminal of die 304 is connected to heat sink 102 by conductor 608. Die 204 is electrically connected to heat sink 102 and is also connected to lead 106 through conductor 610. A more detailed schematic of the electrical connections of package 600 is given in FIG. 7.

A comparative computer model was used to compare the heat dissipation capabilities of package 100 and package 600. In this model, computer simulations were used to predict the temperature of the dies 112 and 113 of package 100, and dies 204 and 304 of package 600. In these simulations both assemblies were disposed on an infinite cooling block made of aluminum with a temperature of 25° C. such that the heat sink 102 is adjacent to the block. In these simulations, the low-melting die adhesive was 88% Pb, 10% Sn, 2% Ag, the high-melting die adhesive was 95.5% Pb, 2% Sn, and 2.5% Ag, the dies were silicone diodes, the insulator was alumina, and the heat sink was pure copper. The power input was 100 W per chip. The temperatures achieved by each of the dies are given in the following table.

|  | Wired Package 600 | Wireless Package 100 | Difference |
|---|---|---|---|
| Die 304/112 | 161° C. | 81° C. | 80° C. |
| Die 204/114 | 88° C. | 81° C. | 7° C. |

The die 304, which is not in thermal contact with heat sink 102 achieves a temperature of 161° C. which is nearly twice as hot as the corresponding die in the wireless package 100. The effect of the die attach pad acting as a thermal conductor may be seen by comparing the temperatures of die 204 (wired attachment) and die 114 (wireless attachment through a thermally conductive die attach pad). The wireless configuration of package 100 is predicted to provide temperature advantage of 7° C. over the corresponding wired configuration.

FIG. 7 is a depiction of package 700, which has first die 702 and second die 704. In the embodiment depicted in FIG. 7, dies 702 and 704 are MOSFET dies. As shown in FIG. 7, lead 110 is attached to heat sink 102, which is contiguous with drain 706a and drain 706b. Sources 708a and 708b are electrically connected to lead 106 while gates 710a and 710b are electrically connected to lead 108. Dies 702 and 704 connect to common lead 110 through heat sink 102.

Those skilled in the art understand that the heat sink 102 may be a simple metal clip or may be more complex. For example, the heat sink 102 could be metal clip with an insulating surface with contacts and/or conductive traces on the insulating surface. In this way, one or more terminals of a die could be connected to terminals of the other die without the need for wires.

While the invention has been described with reference to preferred embodiments, it will be understood by those skilled in the art that various changes may be made and equivalents may be substituted for elements thereof to adapt to particular situations without departing from the scope of the invention. Therefore, it is intended that the invention not be limited to the particular embodiments disclosed as the best mode contemplated for carrying out this invention, but that the invention will include all embodiments falling within the scope and spirit of the appended claims.

What is claimed is:

1. A multichip module for wirelessly connecting two or more dies to three external leads comprising:
   a heat sink having first and second surfaces and comprising a thermally and electrically conductive material;
   first and second dies, each die having at least one terminal on its upper surface and one terminal on its lower surface, said dies attached to one of the surfaces of the heat sink to establish an electrical connection between the terminals and the heat sink;
   a lead frame comprising three elongated leads, each lead having a die attach pad at one end that is disposed inside a packaging material and the other end extending from the packaging material, wherein
   a first lead has its die attach pad connected to the first die,
   a second lead has its die attach pad connected to the second die and
   a third lead has its die attach pad connected to the heat sink, whereby the first lead provides an external connection to the first die, the second lead provides an external connection to the second die, and the third lead provides an external connection to the electrical connection of the terminals on the lower surfaces of the dies; and
   the packaging material encapsulating a portion of the leads, the dies and the heat sink and leaving exposed the other surface of the heat sink for transferring heat from the dies to the ambient surroundings.

2. The module as recited in claim 1, wherein the module has a mounting hole.

3. The module as recited in claim 1, wherein the first and second dies are diodes.

4. The module as recited in claim 1, wherein the first and second dies are MOSFET dies.

5. A packaged semiconductor assembly comprising
   a packaging material, at least one side of which is comprised of an electrically conductive and thermally conductive heat sink;
   a first, second and third elongated lead, each lead having a die attach pad at one end that is disposed inside the packaging material and the other end extending from the packaging material;
   a first and second diode, both of which are disposed within the packaging material, each die having at least one terminal on its upper surface and one terminal on its lower surface, said diodes wirelessly attached to one of the surfaces of the heat sink to establish an electrical connection between the terminals and the heat sink;
   the first diode is wirelessly connected to the die attach pad of the first lead;
   the second diode is wirelessly connected to the die attach pad of the second lead; and
   the heat sink is wirelessly connected to the third lead.

6. The assembly as recited in claim 5, wherein the surface area of the first diode is contiguous with the die attach pad of the first lead such that at least half of the surface area of the first diode is covered by the die attach pad of the first lead.

7. The assembly as recited in claim 6, wherein the surface area of the second diode is contiguous with the die attach pad of the second lead such that at least half of the surface area of the second diode is covered by the die attach pad of the first lead.

8. The assembly as recited in claim 5, wherein the first diode and the second diode are connected in series.

9. The assembly as recited in claim 5, wherein the first and second diodes are wirelessly attached to one of the surfaces of the heat sink with a first solder, and are connected to the die attach pads of the first and second leads, respectively, using a second solder, wherein the first solder and second solder have a difference in melting point of at least about 10° C.

10. A multichip module for wirelessly connecting two or more dies to three external leads comprising:
   a heat sink having first and second surfaces and comprising a thermally and electrically conductive material;
   first and second dies connected in series, each die having at least one terminal on its upper surface and one terminal on its lower surface, said dies attached to one of the surfaces of the heat sink to establish an electrical connection between the terminals and the heat sink;
   three elongated leads, each lead having a die attach pad at one end that is disposed inside a packaging material and the other end extending from the packaging material, wherein a first lead has its die attach pad attached to the first die such that heat is transferred from the first die to its die attach pad, a second lead has its die attach pad attached to the second die such that heat is transferred from the second die to its die attach pad, and a third lead has its die attach pad connected to the heat sink, whereby the first lead provides an external connection to the first die, the second lead provides an external connection to the second die, and the third lead provides an external connection to the electrical connection of the terminals on the lower surfaces of the dies; and the packaging material encapsulating a portion of the leads, the dies and one surface of the heat sink and leaving exposed the other surface of the heat sink for transferring heat from the dies to the ambient surroundings.

11. The assembly as recited in claim 10, wherein the heat sink is comprised of copper.

12. The assembly as recited in claim 10, wherein the first semiconductor die and the second semiconductor die are attached in series without wires.

13. The assembly as recited in claim 10, wherein the first and second semiconductor dies are diodes.

\* \* \* \* \*